United States Patent [19]

Tults

[11] Patent Number: 5,303,398
[45] Date of Patent: Apr. 12, 1994

[54] STABILITY DETECTION METHOD AND APPARATUS FOR A TUNING SYSTEM

[75] Inventor: Juri Tults, Indianapolis, Ind.

[73] Assignee: Thomson Consumer Electronics, Inc., Indianapolis, Ind.

[21] Appl. No.: 488,645

[22] Filed: Mar. 9, 1990

[51] Int. Cl.⁵ ............................................. H04B 1/16
[52] U.S. Cl. ............................. 455/182.1; 455/182.3; 455/192.3; 455/197.1; 455/265
[58] Field of Search ............... 455/183, 182, 192, 196, 455/195, 164, 165, 182.1, 182.2, 182.3, 183.1, 192.2, 192.3, 197.1, 198.1, 260, 265; 358/191.1, 193.1, 195.1

[56] References Cited

U.S. PATENT DOCUMENTS

| | | | |
|---|---|---|---|
| 4,218,657 | 8/1980 | Rast | 455/182 |
| 4,429,415 | 1/1984 | Chin et al. | 455/164 |
| 4,868,892 | 9/1989 | Tults et al. | 455/182 |
| 4,995,098 | 2/1991 | Tanasalem et al. | 455/165.1 |
| 5,065,244 | 11/1991 | Ismiguro et al. | 455/164 |

Primary Examiner—Reinhard J. Eisenzopf
Assistant Examiner—Chi Pham
Attorney, Agent, or Firm—Joseph S. Tripoli; Peter M. Emanuel

[57] ABSTRACT

An indication of stability of a tuning system after changing the local oscillator frequency to a predetermined frequency, such as a frequency corresponding to a new channel during a channel changing operation or to a new search frequency during a search, is provided by monitoring an AFT signal during the frequency changing operation and determining when it remains consistent for a predetermined time.

20 Claims, 4 Drawing Sheets

STABILITY DETECTION METHOD AND APPARATUS FOR A TUNING SYSTEM

FIELD OF THE INVENTION

The present invention concerns a tuning system including apparatus for determining when the tuning system has achieved stability, e.g., after a new channel has been selected.

BACKGROUND OF THE INVENTION

RF television signals may have carriers with non-standard frequencies near respective standard (i.e., "broadcast") frequencies. Such non-standard frequency RF television signals may be provided by cable distribution networks or television accessories such as a VCR, video disk player, video camera or video game. Accordingly, many tuning systems include search provisions which change the frequency of the local oscillator signal in a step-wise search in the vicinity of the nominal local oscillator frequency for a newly selected channel until correct tuning is achieved. It is desirable that the tuning system be relatively stable after a new channel is selected or after a new step is taken so that the output signals of the detectors utilized for the search can be relied on.

One method of determining that a tuning system has achieved stability after a new channel has been selected or after a new step is taken in a search is to provide a time delay corresponding to the time required for stability to be achieved. With regard to channel changes, the required time delay varies with the "spacing" between the previous channel and the new channel. That is, it takes longer for a tuning system to make a channel change between channels at opposite ends of a tuning band (e.g., channels 2 and 6 in the low VHF television band) than it does to make a channel change between adjacent channels (e.g., channels 2 and 3). Accordingly, the time delay is usually set to the longest required time delay. Considering that the display of a television system is often "blanked" so as to prevent the display of transient effects during maximum time required for any channel change operation, including any search, e.g., in the order of 0.5 seconds, the apparent tuning time which the user is exposed to may be much greater than the actual tuning time required for a particular channel change operation. This irritating problem is multiplied when a user used "channel up" and "channel down" scanning buttons which are conventionally provided to allow the user to browse through various channels in sequence.

Phase locked loop (PLL) tuning systems sometimes include a so-called "lock" detector for determining when the tuning process has achieved substantial stability. A lock detector examines an error signal including pulses representing the phase and frequency differences between the local signal and a reference frequency signal, and generates a "lock" signal when the pulses of the error signal have become narrower than a predetermined width.

Most present PLL tuning systems are to a large extent incorporated within an integrated circuit (IC). While many PLL ICs are available, many do not include a lock detector. For example, a lock detector may not be provided if the PLL is incorporated in a control IC which is intended to control many other functions of a television system, in addition to tuning control, and IC (or "chip") area is at a premium. A lock detector may also not be provided in a PLL IC dedicated to tuning control because of the desire to save external connection terminals as well as chip area.

Thus, there is a need for a method and apparatus for detecting when a tuning system, which may not include a lock detector, has achieved stability and which does not require the same maximum time delay for every tuning change.

SUMMARY OF THE INVENTION

According to an aspect of the present invention, an indication of the stability of a tuning system after the initiation of a tuning change operation during a channel change or search operation can be adaptively provided by monitoring IF frequency representative signal such as the S-shaped AFT signal.

Specifically, in an embodiment of the invention, after a tuning change is initiated, the tuning control unit (e.g. a microprocessor) monitors the AFT signal during a tuning change operating. If the AFT signal has a level corresponding to one of the two AFT humps for a predetermined time duration, e.g., 20 milliseconds (ms), the control unit regards this as an indication of the completion of the tuning change operation and of the tuning system stability. At this point, a further tuning operation, such as a fine tuning or search operation may be reliably initiated.

Should the AFT signal not remain at the level corresponding to one of the AFT humps for the predetermined time duration (20 ms), the tuning change operation is regarded as complete (stabilized) at the end of a greater time duration (e.g., 250 ms) corresponding to the expected maximum time duration required for the tuning change operation.

DETAILED DESCRIPTION OF THE DRAWING

Figures 1, 1A:
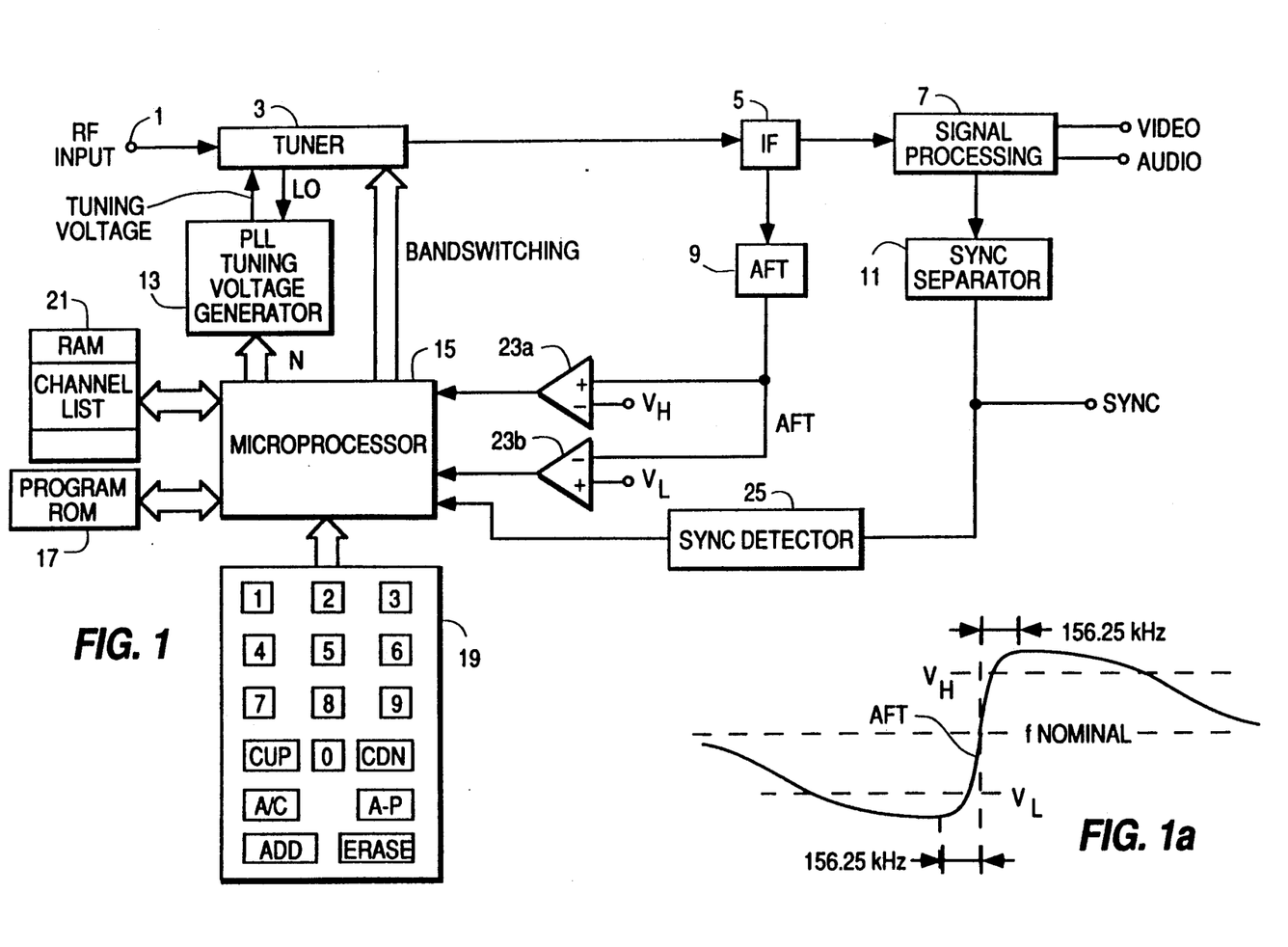
FIG. 1 shows a block diagram of a television receiver employing a tuning system in which the present invention may be embodied.
FIG. 1a shows an AFT signal waveform useful in understanding an aspect of the operation of the tuning system shown in FIG. 1.

The television receiving system shown in FIG. 1 includes an RF input 1 which is connected to a tuner 3. Although not shown, as is well known, tuner 3 includes an RF stage and local oscillator responsive to band selection signals and to a tuning voltage for converting (heterodyning) the RF signal associated with a selected channel to a corresponding IF signal. The band selection signals determine the tuning configuration of the RF stage and the local oscillator according to the tuning band of the selected channel. The magnitude of the tuning voltage determines the RF signal selected by the RF stage and the frequency of the local oscillator.

The IF signal is processed in conventional fashion in an IF section 5 and coupled to a signal processing section 7. Signal processing section 7 demodulates the modulated picture and sound carriers of the IF signal to produce baseband video and audio signals at respective outputs.

An automatic fine tuning (AFT) signal representing the deviation, if any, of the frequency of the picture carrier of the IF signal from a nominal frequency value, e.g., 45.75 MHz in the United States, is generated by an AFT detector 9. The typical S-shaped waveform of the AFT signal is shown in FIG. 1a. The polarity of the AFT signal relative to an amplitude level corresponding to the nominal frequency represents the sense of the frequency deviation with respect to the nominal frequency and the amplitude of the AFT signal represents the magnitude of the frequency deviation. By way of example, negative-going excursions below the amplitude level corresponding to the nominal frequency correspond to negative frequency deviations and positive-going excursions correspond to positive frequency deviations. The AFT signal is utilized in the tuning process as will be described below.

A composite synchronization ("sync") signal is derived from the video signal by a sync separator 11. In addition to its conventional use of image synchronization, the composite synchronization signal is also utilized in the tuning process as will also be explained below.

The tuning voltage for tuner 3 is generated by a tuning voltage generator 13 in response to a digital signal related to the selected channels. Tuning voltage generator 13 may be of the voltage synthesis type including a digital-to-analog converter or of the frequency synthesis type including a frequency or phase locked loop. By way of example, a phase locked loop (PLL) tuning voltage generator is employed in the exemplary embodiment.

Briefly, a PLL tuning voltage generator includes a cascade of a fixed frequency divider (usually referred to as a "prescaler") for dividing the frequency of the local oscillator signal by a factor K and a programmable frequency divider for dividing the frequency of the output signal of the prescaler by a programmable factor N. A fixed frequency divider divides the frequency ($f_{XTAL}$) of the output signal of a crystal oscillator by a factor R to derive a reference frequency signal. A phase comparator compares the output signal of the programmable divider to the reference frequency signal to generate an "error" signal having pulses representing the phase and frequency deviations between the output signal of the programmable divider and the reference frequency signal. The error signal is filtered to produce the tuning voltage. The tuning voltage controls the frequency ($f_{LO}$) of the local oscillator until:

$$f_{LO} = (NK/R) f_{XTAL}$$

Thus, the frequency of the local oscillator signal can be controlled by controlling programmable factor N. If K, R and $f_{XTAL}$ are selected so that $(K/R)f_{XTAL}$ equals 1 MHz, N is equal, in MHz, to the frequency of the local oscillator signal.

A microprocessor 15 generates a digital representation of the programmable factor N for controlling the frequency of the local oscillator signal and the band selection signals for tuner 3. Microprocessor 15 operates under the control of a computer program stored in a read-only-memory (ROM) 17. The portion of the program germane to the present invention is shown in flowchart form in FIGS. 3 and 4. Microprocessor 15 responds to user command signals generated by a user control keyboard 19. Although keyboard 19 is shown directly connected to microprocessor 15 for simplicity, it may comprise the keyboard of a remote control unit.

Keyboard 19 includes keys for controlling various functions of the television receiver such as turning the receiver "on" and "off", controlling the volume level, and selecting channels to be tuned. Only the keys germane to channel selection are shown.

Digit keys (0–9) are provided for directly selecting a channel by entering the tens and units digits of the respective two digit channel number.

"Channel up" (CUP) and "channel down" (CDN) keys are provided for initiating a "channel scanning" mode of channel selection in which channels are successively tuned in increasing or decreasing frequency order until a channel in a list of active channels is located. Those channels not in the list will be automatically skipped over during the channel scanning mode.

The list of active channels is stored in a non-volatile random access memory (RAM) 21 associated with microprocessor 15. RAM 21 includes a plurality of one-bit memory locations for respective channels. A logic "1" is stored in the memory locations for each active channel and a logic "0" is stored in the memory locations for each inactive channel. The memory locations are addressed in accordance with the channel number of the selected channel.

Keyboard 19 also includes an "autoprogram" (A-P) key for initiating an "auto-programming" operation in which the active channel list of RAM 21 is automatically "programmed". During the auto-programming operation, each of the channels are sequentially selected for tuning and a determination is made whether or not a valid RF television signal is present. A logic "1" is entered into the respective one-bit memory location of RAM 21 if a valid RF television signal is present and a logic "0" is entered if a valid RF television signal is not present. Keyboard 19 includes "erase" and "add" keys for manually deleting and adding channels from the list stored in RAM 21.

RF input 1 may be connected to a broadcast receiving antenna, a cable distribution network, or a television accessory such as a VCR, video disk player, video camera or video game. The RF signals for air channels occupy low VHF, high VHF and UHF tuning bands and have carriers with standard frequencies assigned by the FCC (Federal Communications Commission). The RF signals for cable channels may also occupy the low VHF, high VHF and UHF bands and in addition may occupy mid, super, hyper and ultra bands interspersed with the low VHF, high VHF and UHF bands.

In the present embodiment the same channel numbers identify different air and cable channels. Accordingly, keyboard 19 includes an "air/cable" (A/C) key for selecting whether "air" (broadcast) or cable channels are to be tuned. A single-bit indicating whether air (e.g., a logic "1") or cable (e.g., a logic "0") channels are to be tuned is stored in RAM 21. Division factor N and the band selection signals are controlled in response to the air/cable selection indication stored in RAM 21 as well as by the channel number of the selected channel.

The values of the division factor N for air channels with standard frrquency RF signals are known in advance for every receiving location. Therefore the precise value of N for each air channel can be stored as part of the control program for microprocessor 15.

The values of division factor N for cable channels and television accessories with non-standard frequency RF signals which may be offset from respective standard frequencies are not known in advance for every receiving location. Therefore, the particular values of N for cable channels and television accessories cannot be stored in advance. Rather, when a cable distribution network or television accessory is connected to RF signal input 1, a search for the correct value of N is conducted for each channel to be tuned. During this search, the value of N is changed in steps in the vicinity of the value of N for a respective standard frequency and, at each value of N, it is determined whether or not a valid television RF signal is present. In the present illustrative tuning system, the presence of a valid RF television signal is determined by examining the conditions of the AFT signal and the composite synchronization (sync) signal, in some cases. AFT comparators 23a and 23b and a sync detector 25 coupled to microprocessor 15 are provided for this purpose.

The search provisions are utilized both in the normal tuning mode (in which channels are selected either directly with the tens and units digit keys or indirectly with the "channel up" and "channel down" keys) and in the auto-programming mode. The step-wise search process is illustrated by the tuning voltage waveforms shown in FIGS. 2a and 2b.

Figure 2A:
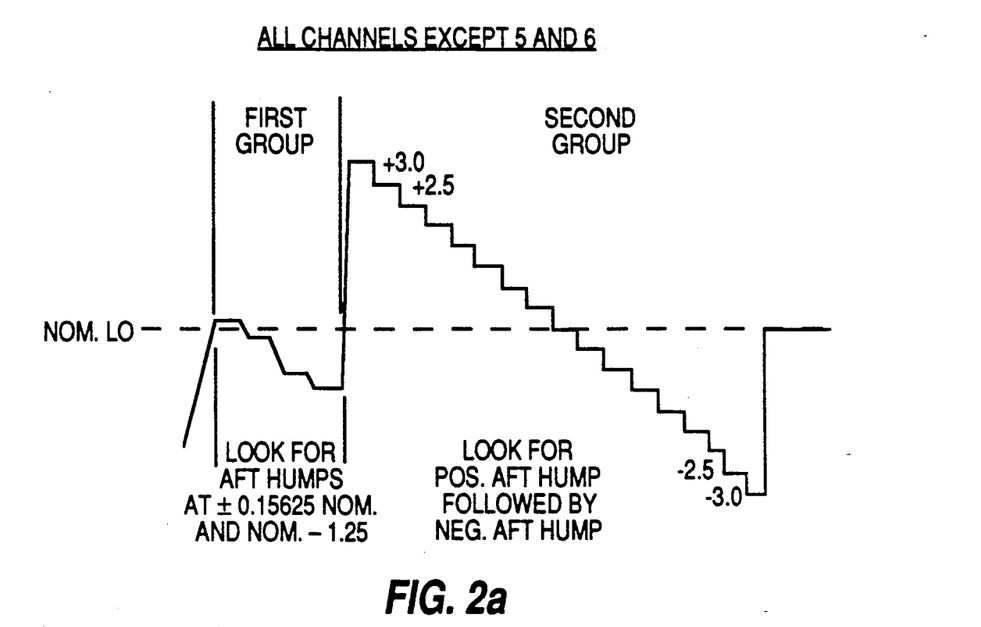
FIGS. 2a and 2b show a tuning voltage waveform illustrating search provisions of the tuning system shown in FIG. 1.
Figure 2B:
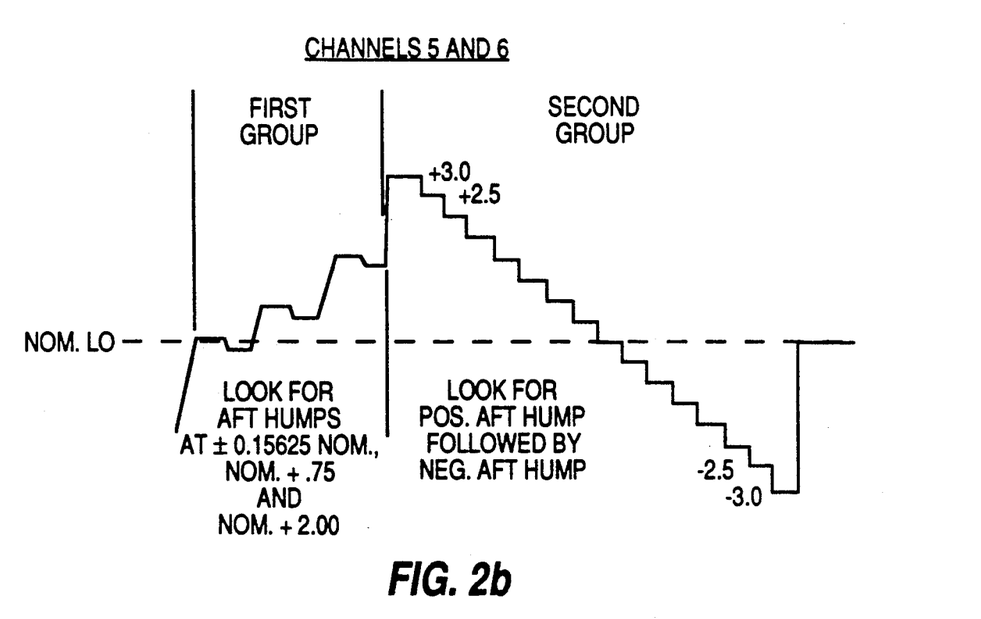

With reference to FIGS. 2a and 2b, it is assumed that a cable distribution network is connected to RF input 1 the air/cable key has been operated to place the tuning system in condition for tuning cable channels.

As is illustrated in FIGS. 2a and 2b, search is partitioned. Initially, in a first search, the presence of an RF signal is tested for at each of a first, relatively small group of values of N corresponding to respective local oscillator search frequencies corresponding to predictable frequencies commonly encountered in cable distribution networks employing "standard", HRC (Harmonically Related Carriers) or IRC (Interval Related Carriers) frequency allocations. Thereafter, in a second search, the presence of an RF signal is tested for at each of a second, relatively large, group of values of N. The search is relatively fast because the most commonly encountered, and therefore most likely, frequencies are examined first. During normal tuning modes, in which only a single channel is selected for tuning, both groups local oscillator search frequencies are utilized. During the auto-programming mode, in which all channels are successively selected for tuning, only the first group is utilized.

The search provisions are not disabled for "air" channels in order to be able to tune non-standard frequency RF signals provided by television accessories. However, since the RF signal for an "air" channel will not likely be found at one of the predictable frequencies of the first group associated with cable channels, other than the standard (i.e., nominal) frequency, only the standard frequency is examined.

During the search of the first or predictable group of frequencies, the AFT signal is examined. As shown in FIG. 1a, the AFT signal has an amplitude above a level $V_H$ at a frequency 156.25 kHz above nominal frequency of the picture carrier an amplitude below a level $V_L$ at a frequency 156.25 kHz below nominal frequency. The amplitude of the AFT signal above level $V_H$ are within a "positive-going" hump region, and the amplitudes above level $V_L$ are within a "negative-going" hump region. The detection of the positive and negative-going humps by AFT comparators 23a and 23b, respectively, indicates the presence of a RF carrier for the selected channel. Accordingly, during the search of the first group of local oscillator search frequencies, the values of division factor N are set to produce ±156.25 kHz pairs of frequencies with respect to the predictable local oscillator search frequencies identified in FIGS. 2a and 2b.

If both the positive-going and negative-going AFT humps are not detected by AFT comparators 23a and 23b at a particular value of N, N is changed to the next search value in the first group of search values. If both AFT humps have not been detected for any search value in the first group, the second search utilizing the search values in the second group is initiated. The second search will be explained below.

If both the AFT humps have been detected for a search value in the first group, the search is terminated and the output signal of sync separator 11 is examined with sync detector 25. The composite synchronization signal is examined because it is possible that the carrier detected by AFT comparators 23a and 23b may be a sound carrier rather than a picture carrier. A suitable sync validity detector which operates by measuring the frequency and pulse width of the pulses of the composite sync signal is described in U.S. Pat. No. 4,405,947, issued to J. Tults and M.P. French.

If the composite synchronization signal has the correct characteristics, the picture carrier of a RF television signal has been located. Thereafter, the frequency of the local oscillator signal is adjusted for and maintained at optimum tuning. This fine tuning operation involves changing the local oscillator frequency in small steps (e.g., 31.25 kHz) until the frequency of the detected IF picture carrier is set between the two humps. This fine tuning operation is described in detail in U.S. Pat. No. 4,868,892 issued to J. Tults, W. J. Testin and M. F. Rumreich.

If the composite synchronization signal does not have the correct conditions, the second search referred to above is also initiated.

During the second search, AFT comparators 23a and 23b are again used to test for the presence of an RF signal for the selected channel at each of the search frequencies of the second group. As shown in FIGS. 2a and 2b, in the present embodiment, this search occurs at 0.5 MHz steps and starts at a local oscillator frequency 3.0 MHz higher than the nominal frequency and ends at local oscillator frequency 3.0 MHz lower than the nominal frequency. The presence of a picture carrier of an RF television signal is indicated when a positive-going AFT hump is detected at one step and a negative-going AFT hump is detected at the following step.

After the presence of the picture carrier of a valid RF signal has been located during the second search, the same operation used to optimize and maintain the frequency of the IF picture carrier between the AFT humps as previously referred to is utilized.

If an RF carrier is not located during the second search, the nominal local oscillator frequency corresponding to the standard frequency RF signal for the selected channel is caused to be generated.

The tuning system so far described is similar to the one incorporated in commercially available RCA brand name color television receivers including CTC 156 and CTC 157 electronic chassis. These chassis are disclosed in "RCA/GE Color Television Service Data—CTC156/157" published by Thomson Consumer Electronics, Indianapolis, Indiana.

When a new channel is selected, a new value of N corresponding to the new channel is transferred to tuning voltage generator 13 from microprocessor 15 and, as a result, the tuning voltage is caused change from the previous level corresponding to the previous channel to a new level corresponding to the new channel. The change in tuning voltage is not instantaneous but rather has a ramp-like waveform. The rate of change (or the "slew rate") depends on the time constant and gain of the tuning system, including the PLL comprising tuning voltage generator 13 in the present embodiment. Before a search can be reliably made to locate the RF signal for the new channel, it must be determined that the operation of the tuning system has stabilized. As earlier noted, in the absence of a "lock" detector or similar arrangement, this could be accomplished by providing a predetermined time delay corresponding to the longest time required for stability to be achieved for any channel change. This would cause the apparent tuning times for all channel changes to be unreasonably long, independent of the separation between the previous and new channels.

The present tuning system utilizes a process of determining when the tuning system has achieved stability which is adaptive with respect to the separation between previous and new channels and differences in tuning speeds of different tuners.

In the exemplary embodiment, this is accomplished by continuously sampling the AFT signal after a new value of N corresponding to the new channel has been entered. As earlier noted with respect to the description of the search process illustrated in FIGS. 2a and 2b, the initial value of N corresponds to a frequency (e.g., nominal +156.25 kHz) at which the positive-going AFT hump is expected to be found if an RF signal is present for the selected channel. If the level of the AFT is above threshold level $V_H$ corresponding to the positive hump for a predetermined minimum time interval, e.g., 20 milliseconds (ms), it indicates that the tuning system has reached stability. The predetermined minimum time is required because as the tuning voltage charges from the level corresponding to the previous channel to the level corresponding to the new channel, it is likely that carriers corresponding to other channels will be encountered and produce an AFT level corresponding to the positive-going hump. At the slew rate, e.g., 0.3 volts per millisecond, the positive-going humps of these intermediate channels will have a much shorter duration, typically about 1 ms, than 20 ms. If a positive-going hump of at least 20 ms exists, the tuning system is considered to have reached stability and a check for the negative-going hump at the nominal frequency minus 156.25 kHz (N−0.156.25) is made to verify the presence of a valid picture carrier as described earlier. Since a RF carrier may not be located at the initial value of N, a predetermined time delay, e.g., 250 ms, is provided to allow the tuning system to stabilize if a positive-going hump of at least 20 ms in duration does not occur. In this operation, the AFT signal is used both to determine when the tuning system has reached stability and also to indicate the presence of an RF signal.

In the exemplary embodiment this adaptive technique of determining when stability has been reached after a channel change is used in both the normal and auto-programming modes. For tuning environments in which most, if not all, the RF signals have standard (i.e., nominal) frequencies, the tuning speed has been found to increase significantly. Typically, the tuning time may be decreased by a factor of 2 to 3.

Figure 3:
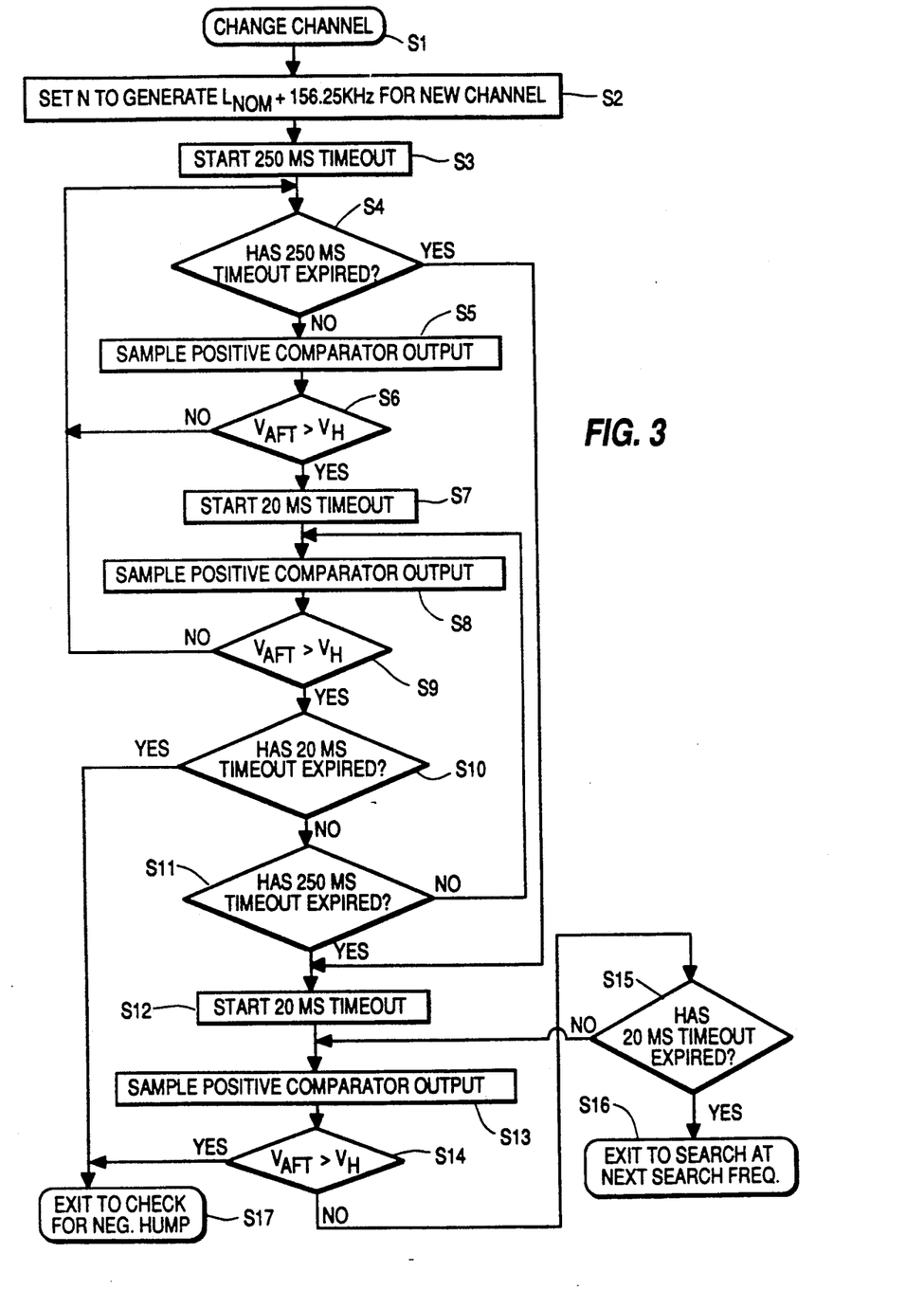
FIGS. 3 and 4 show flowcharts of the portions of a program for controlling the tuning system shown in FIG. 1 incorporating adaptive stability indicating algorithms according to aspects of the present invention.

The flow chart for the portion of the control program for microprocessor 15 is illustrated in FIG. 3. In the following explanation, the steps of the program illustrated in FIG. 3 are indicated where appropriate.

As indicated in FIG. 3, once the command to tune a new channel has been entered (S1), microprocessor 15 sets the value of N to correspond to the nominal local oscillator frequency new channel ($LO_{NOM}$) plus 156.25 kHz, i.e., microprocessor sets N to tune the expected frequency for the positive-going AFT hump (S2).

Thereafter, a so-called "timeout" timer for a 250 ms time interval is started by microprocessor 15 (S3), and microprocessor 15 begins to sample the output of "positive" AFT comparator 23a (S5). The sampling continues until a positive-going AFT hump is detected (S6), or until the 250 timeout has expired (S4). The sampling occurs at a rate determined by the instruction cycle time of the particular microprocessor utilized. For example, the so-called "TELEKAT" television control IC including both a 6805 based microprocessor and a PLL, available from Motorola, can obtain and process a sample in about 50 microseconds.

If a positive-going AFT hump exists within the 250 ms time interval (S6), a "timeout" timer for a 20 ms time interval is started (S7), and microprocessor 15 continues to sample output of positive AFT comparator 23a (S8). If the positive-going AFT hump exists for 20 ms within the 250 ms time interval (S8,S9,S10,S11), this results is taken as an indication that the local oscillator frequency is stable. At this point, the local oscillator frequency is reduced by 2×156.25 kHz to ($LO_{NOM}$−156.25 kHz) and the output of "negative" AFT comparator 23b is examined to check for the negative-going AFT hump (S17).

If a positive-going AFT hump is not detected within the 250 ms time interval (S6,S4), or a positive-going AFT hump does not exist for at least 20 ms within the 250 ms time interval (S9,S10,S11), the output of positive AFT comparator 23a is sampled for an additional 20 ms time interval to check one last time for the existence of a positive-going AFT hump (S12,S13,S14,S15). If the output of positive AFT detector 23a is "high" for any sample within the 20 ms time interval during this test (S14,S15), it indicates that a positive-going AFT hump for the new channel is present and a check is then made for the negative-going hump (S17). This last test is conducted because although a picture carrier may be present, it may be overmodulated with video information. An overmodulated picture carrier may "dropout" except during the vertical retrace interval (when picture carrier is usually modulated only with synchronization information). The 20 ms time interval is selected for this test because it is long enough to include one complete vertical time interval (approximately 16.7 ms). If a positive-going AFT hump is not detected, a search is initiated by changing the value of N, as earlier explained.

It is also desirable to determine when the tuning system has stabilized after a change has been made during the search operation. Although the frequency steps are smaller than the channel spacing (e.g., 6 MHz), damped oscillations of the tuning voltage lasting several hundred milliseconds may occur when a search step is made for channels at the upper end of a tuning band where the loop gain of the PLL is low. Fixed time delays provided to ensure stability at such channels would cause the search operation to be equally slow for other channels.

A adaptive timeout algorithm, similar, to the one used to determine when the tuning system has stabilized after a channel change, can be utilized to determine when the tuning system has stabilized after a step-wise change during the search operation illustrated in FIGS. 2a and 2b. However, it is not known in advance at which search frequency the positive-going AFT hump is likely to be encountered. Accordingly, rather than looking for the continuous presence of the positive-going AFT for a predetermined time interval, e.g., 20 ms, after a change during the search process the AFT signal is continuously sampled to determine if the AFT level remains substantially unchanged for a predetermined number of consecutive time intervals. In the illustrative embodiment, these time intervals are also each 20 ms so as to include the vertical retrace intervals in which the picture carrier is not overmodulated. In the illustrated embodiment, 2 consecutive 20 ms time intervals for which the AFT level is the substantially same indicates stability for small steps, and 3 consecutive 20 ms time intervals indicates stability for larger steps in the order of 0.5-1 MHz. The flow chart for the portion of the program of microprocessor 15 used to determine stability after each step of the search operation is shown in FIG. 4.

Figure 4:
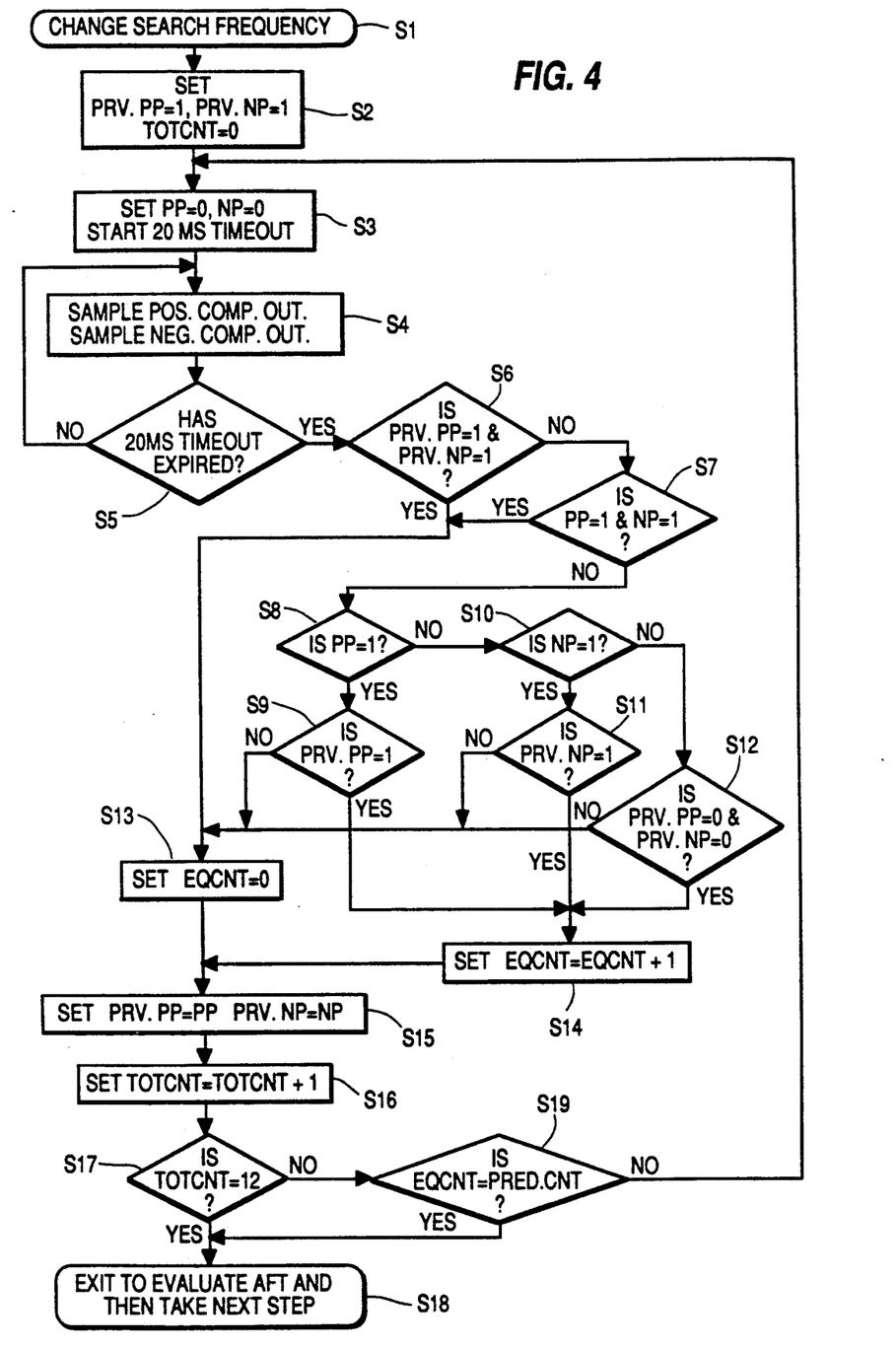

Certain parameters utilized in the adaptive timeout algorithm illustrated in FIG. 4 are identified as follows.

PP is set to a logic "1" if a positive-going AFT peak is detected in a current 20 ms time interval (and to a logic "0" when a positive peak is not detected).

NP is set to a "1" when a negative-going AFT peak (hump) is detected in a current 20 ms time interval.

PRV.PP is a logic "1" if a positive-going peak (hump) was detected in the previous 20 ms time interval.

PRV.NP is a logic "1" if a negative-going peak (hump) was detected in the previous 20 ms time interval.

EQCNT is the count (number) of identical results representing a stable condition in consecutive 20 ms time intervals. The following conditions cause EQCNT to be increased by 1: PP and PRV.PP are both="1"; NP and PRV.NP are both="1"; and PP, NP PRV.PP and PRV.NP are all="0". If both PP and NP or PRV.PP and PRV.NP have been set="1" during a 20 ms time interval, EQCNT is not increased. The value of EQCNT which identifies stability (indicated as PRED.CNT) depends on the step size (e.g., 1 for 31.25 kHz steps and 2 for 0.5 MHz and larger steps).

TOTCNT is the total count (number) of consecutive 20 ms time intervals. TOTCNT=12 (corresponding to approximately 12×20 ms=240 ms) indicates a default condition in which the search portion of the main program is allowed to continue.

Turning now to the flow chart shown in FIG. 4, when a new search step is made by changing the value of N (S1), PRV.PP and PRV.NP are initialized by setting each to "1" and TOTCNT is initialized by setting it to 0 (S2). Thereafter, 20 ms time interval a 20 ms timeout timer is set and PP and NP are initialized by setting each to "0" (S3).

Thereafter, until the 20 ms time interval has expired (S5), the outputs of each of AFT comparators 23a and 23b are continuously sampled and the results stored in the registers corresponding to PP and NP (S4). Here again the sampling rate is determined by the instruction cycle time of microprocessor 15.

When the 20 ms time interval has expired (S5), the contents of the registers corresponding to the parameters PP, NP, PRV.PP and PRV.NP are evaluated to determine if the AFT level is substantially the same for 2 consecutive time intervals (S6,S7,S8,S9,S10,S11,S12). If there is no AFT signal level equality between the previous and current 20 ms time intervals, EQCNT is set to a "0" (S13). If both the positive-going and negative-going AFT humps have been detected in the previous 20 ms time interval (S6), or in the current 20 ms time interval (S7), it is considered that the local oscillator frequency is not yet stable, and any indications of AFT signal level equality between the previous and current 20 ms time intervals are ignored. In that case EQCNT is also set to a "0" (S13). (As earlier noted, whenever a new step is taken PRV.PP and PRV.NP are initially each set to a "1".) If there is an AFT signal level equality between the previous and current 20 ms time intervals, EQCNT is increased by "1" (S14).

After the evaluation of AFT signal level equality, the contents of the registers corresponding to PP and NP are stored in the registers corresponding to PRV.PP and PRV.NP, respectively, (S15) so as to be available in the next 20 ms time interval, and TOTCNT is increased by "1" (S16).

Thereafter, the parameters TOTCNT and EQCNT are evaluated (S17,S19) to determine if stability has been achieved. As earlier noted, if TOTCNT has reached 12, corresponding to 12×20 ms=240 ms (S17), the next step in the search algorithm is taken (S19). However, if TOTCNT has not yet reached 12 (S17), EQCNT is evaluated (S19). If EQCNT equals the predetermined count (PRED. CNT) for the particular step size used in the current portion of the search algorithm, the next step in the search algorithm is taken. Otherwise, the next 20 ms time interval is initiated (S3).

This process continues until it is determined that the required number of "identical" consecutive 20 ms intervals have occurred, or 12 cycles of this process have occurred.

As earlier noted, the adaptive "timeout" provisions significantly reduce the time required for the tuning operation. This is particularly important in connection with the auto-programming features of the tuning system. It is also noted that the adaptive nature of the present invention allows a manufacturer to utilize various tuners (including the RF, local oscillator and mixer sections) with different characteristics without significant hardware changes to the tuning control system. Only changes of program parameters (e.g., EQCNT, TOTCNT and the 250 ms timeout) might be needed.

Various modifications may be made to the exemplary embodiments.

For example, the negative-going AFT hump may be tested for before the positive-going AFT hump. AFT comparators 23a and 23b may be replaced by a digital comparison arrangement in which the analog AFT signal is converted to a digital representation which is compared to digital values corresponding to threshold levels $V_H$ and $V_L$. In a similar vein, AFT detector 9 may be replaced by a digital counter arrangement for measuring the frequency of the IF signal directly. In that case, stability may be determined when the measured IF frequency remains substantially constant for a predetermined time interval after a new channel is selected or a new search step is taken. Further, depending on the accuracy of sync detector 25, stability may be determined when the output of sync detector 25 remains substantially constant for a predetermined time interval. The sync detector disclosed in the Tults and French patent referred to above is suitable for such purpose.

While the invention has been described with reference to a PLL frequency synthesis tuning system, it may also be advantageously employed in other types of tuning systems.

While the adaptive "timeout" provisions for indicating when the tuning system has achieved stability have been described in connection with the initiation of a search operation, they may be also used to indicate when a display should be "unblanked" after a channel change.

These and other modifications are intended to be within the scope of invention defined by the following claims.

What is claimed is:

1. A tuning system comprising:
   means for providing an RF signal;
   means for generating a local oscillator signal;
   means for combining said local oscillator signal with said RF signal to produce an IF signal having a nominal frequency when a correct tuning condition exists;
   means responsive to said IF signal for generating a signal having a characteristic indicative of the relationship of the frequency of said IF signal to said nominal frequency;
   means for controlling said local oscillator signal generating means so as to change the frequency of said local oscillator signal from a first frequency to a second, predetermined frequency; said controlling means monitoring said IF frequency indicative signal and generating an indication of the stability of said local oscillator signal when said IF frequency indicative signal remains consistent for a first predetermined time period, and generating said stability indication after a second predetermined time period, longer than said first predetermined period, if said IF frequency indicative signal does not remain consistent for said first predetermined time period.

2. The tuning system recited in claim 1, wherein:
   said means responsive to said IF signal has an amplitude versus frequency characteristic with a first amplitude sense for a first sense of frequency deviation between the frequency of said IF signal and said nominal frequency and a second amplitude sense for a second sense of frequency deviation between the frequency of said IF signal and said nominal frequency; and
   said controlling means generates said stability indication when said IF frequency indicative signal has an amplitude exceeding a predetermined threshold for said first predetermined time period.

3. The tuning system recited in claim 2, wherein:
   said first frequency corresponds to a first channel and said second frequency corresponds to a second channel.

4. The tuning system recited in claim 1, wherein:
   said means responsive to said IF signal has an amplitude versus frequency characteristic with a first amplitude sense for a first sense of frequency deviation between the frequency of said IF signal and said nominal frequency and a second amplitude sense for a second sense of frequency deviation between the frequency of said IF signal and said nominal frequency; and
   said controlling means generates said stability indication if said signal responsive to said IF signal remains within the same amplitude region of said amplitude versus frequency characteristic for said first predetermined time period.

5. The tuning system recited in claim 4, wherein:
   said controlling means samples said signal responsive to said IF signal during consecutive time intervals and generates said stability indication when samples in a predetermined number of consecutive time intervals corresponding to said first predetermined time period corresponds to the same amplitude region of said amplitude versus frequency characteristic.

6. The tuning system recited in claim 4, wherein:
   said first and second frequencies are search frequencies.

7. The tuning system recited in claim 4, wherein:
   said controlling means samples said signal responsive to said IF signal during consecutive time intervals and generates said stability indication when said samples in a predetermined number of consecutive time intervals corresponding to said first predetermined time period are consistent.

8. A tuning system comprising:
   an RF input for receiving an RF signal;
   local oscillator means for generating a local oscillator signal;
   mixer means for combining said local oscillator signal and said RF signal to produce an IF signal having a nominal frequency when a correct tuning condition exists;
   AFT means responsive to said IF signal for generating an AFT signal representing the frequency relationship of said IF signal with respect to said nominal frequency and having an amplitude versus frequency characteristic with a relatively positive amplitude region above a first reference level, a relatively negative amplitude region below a second reference level, and an intermediate amplitude region between said first and second reference levels; and
   control means for controlling said local oscillator means;
   said control means causing the frequency of said local oscillator signal to change from a first frequency corresponding to a first channel to a second predetermined frequency corresponding to a second predetermined channel during a channel change operation; said second predetermined frequency corresponding to one of said relatively positive or negative amplitude regions; said control means monitoring said AFT signal during said channel change operation and generating a stability indication when said AFT signal remains within said one of said regions for a first predetermined time period and otherwise generating said stability indicating signal after a second predetermined time period, longer than said first predetermined time period.

9. The tuning system recited in claim 8, wherein:
   said control means comprises a closed loop tuning system.

10. The tuning system recited in claim 9, wherein:
    said control means comprises a phase-locked loop.

11. The tuning system recited in claim 8, wherein:

said channel change operation is within a sequence of channel change operations.

12. A tuning system comprising:
an RF input for receiving an RF signal;
local oscillator means for generating a local oscillator signal;
mixer means for combining said local oscillator signal and said RF signal to produce an IF signal having a nominal frequency when a correct tuning condition exists;
AFT means responsive to said IF signal for generating an AFT signal representing the frequency relationship of said IF signal with respect to said nominal frequency and having an amplitude versus frequency characteristic with a relatively positive amplitude region above a first reference level, a relatively negative amplitude region below a second reference level, and an intermediate amplitude region between said first and second reference levels; and
control means for controlling said local oscillator means;
said control means causing the frequency of said local oscillator signal to change from a first frequency to a second predetermined frequency; said control means monitoring said AFT signal during the frequency changing operation and generating a stability indication when said AFT signal remains within one of said regions for a first predetermined time period and otherwise generating said stability indicating signal after a second predetermined time period, longer than said first predetermined time period.

13. The tuning system recited in claim 12, wherein:
said control means samples said AFT signal during consecutive time intervals and generates said stability indicating when said AFT signal is in said one of said regions for a predetermined number of consecutive time intervals corresponding to said first predetermined time period.

14. The tuning system recited in claim 13, wherein:
said control means comprises a closed loop tuning system.

15. The tuning system recited in claim 14, wherein:
said control means comprises a phase-locked loop.

16. The tuning system recited in claim 13, wherein:
said frequency change operation is within a sequence of frequency change operations comprising a search.

17. A tuning system comprising:
an RF input for receiving an RF signal;
local oscillator means for generating a local oscillator signal;
mixer means for combining said local oscillator signal and said RF signal to produce an IF signal having a nominal frequency when a correct tuning condition exists;
AFT means responsive to said IF signal for generating an AFT signal representing the frequency relationship of said IF signal with respect to said nominal frequency and having an amplitude versus frequency characteristic with a relatively positive amplitude region above a first reference level, a relatively negative amplitude region below a second reference level, and an intermediate amplitude region between said first and second reference levels; and
control means for controlling said local oscillator means;
said control means causing the frequency of said local oscillator signal to change from a first frequency to a second predetermined frequency; said control means sampling said AFT signal within consecutive time intervals during the frequency changing operation and generating a stability indicating signal when said AFT signal is in one of said regions for a predetermined number of consecutive time intervals corresponding to a first predetermined time period and otherwise generating said stability indicating signal after a second predetermined time period, longer than said first predetermined time period.

18. The tuning system recited in claim 17, wherein:
said control means comprises a closed loop tuning system.

19. The tuning system recited in claim 18, wherein:
said control means comprises a phase-locked loop.

20. The tuning system recited in claim 17, wherein:
said frequency change operation is within a sequence of frequency change operations comprising a search.

* * * * *